(12) United States Patent
Carswell et al.

(10) Patent No.: US 9,401,285 B2
(45) Date of Patent: Jul. 26, 2016

(54) CHEMICAL MECHANICAL PLANARIZATION TOPOGRAPHY CONTROL VIA IMPLANT (71) Applicant: Micron Technology, Inc., Boise, ID (US)

(72) Inventors: Andrew Carswell, Boise, ID (US); Tony M. Lindenberg, Boise, ID (US); Mark Morley, Highland, UT (US); Kyle Ritter, Boise, ID (US); Lequn Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/571,946

(22) Filed: Dec. 16, 2014

(65) Prior Publication Data

US 2016/0172208 A1 Jun. 16, 2016

(51) Int. Cl.
H01L 21/306 (2006.01)
H01L 29/36 (2006.01)
H01L 21/02 (2006.01)
H01L 21/308 (2006.01)
H01L 29/16 (2006.01)
H01L 23/528 (2006.01)

(52) U.S. Cl.
CPC .... *H01L 21/30625* (2013.01); *H01L 21/02164* (2013.01); *H01L 21/02532* (2013.01); *H01L 21/02694* (2013.01); *H01L 21/308* (2013.01); *H01L 23/528* (2013.01); *H01L 29/16* (2013.01); *H01L 29/36* (2013.01)

(58) Field of Classification Search
None
See application file for complete search history.

(56) References Cited

U.S. PATENT DOCUMENTS

| 2004/0155341 | A1* | 8/2004 | Pipes | H01L 21/76237 257/751 |
|---|---|---|---|---|
| 2009/0227087 | A1* | 9/2009 | Ramappa | H01L 21/30625 438/460 |
| 2013/0147067 | A1 | 6/2013 | Amoah et al. | |

* cited by examiner

*Primary Examiner* — Asok K Sarkar
(74) *Attorney, Agent, or Firm* — Perkins Coie LLP (57) ABSTRACT

Systems and methods for chemical mechanical planarization topography control via implants are disclosed. In one embodiment, a method of manufacturing a semiconductor device includes increasing the content of at least one of silicon or germanium in at least select regions of a dielectric material thereby reducing the material removal rate for a chemical mechanical polishing (CMP) process at the select regions, and removing material from the dielectric material using the CMP process. In another embodiment, a method of manufacturing a semiconductor device includes increasing content of at least one of boron, phosphorus, or hydrogen in at least select regions of a dielectric material thereby increasing the material removal rate of a CMP process at the select regions, and removing material from the dielectric material using the CMP process.

25 Claims, 8 Drawing Sheets

CHEMICAL MECHANICAL PLANARIZATION TOPOGRAPHY CONTROL VIA IMPLANT

TECHNICAL FIELD

The disclosed embodiments relate to semiconductor devices and more particularly to systems and methods for planarizing surfaces thereof.

BACKGROUND

Chemical mechanical planarization (CMP)—also referred to as chemical mechanical polishing—is a common technique used in semiconductor processing to remove topography from thin films or other surfaces. CMP processes involve applying a chemical solution, such as a slurry containing an abrasive material, between a surface of a semiconductor workpiece and a rotating pad. Pressure is applied to the polishing pad such that the chemical solution, abrasive materials in the slurry, and/or the pad remove material from the surface of the semiconductor workpiece until a desired amount of material has been removed from the surface. Additionally, the process is often continued until the surface is substantially planar.

One challenge of CMP processes is the difficulty to achieve the requisite planarity. For example, when the surface includes relatively large "open" areas (e.g., areas having a low density, or no circuit elements, such as wires, interconnects, etc.), CMP can cause dishing of the thin film which introduces undesired topography. Previous attempts to address this problem have included adding fill structures in the open regions. However, adding fill material in such regions is impractical in certain processes, such as more recent vertical integration schemes that require regions which cannot accept a fill material. To address this problem in vertical integration schemes, carbon has been implanted into an $SiO_x$ film to change the CMP material removal rate in select areas. The introduction of carbon into dielectric materials, however, can interfere with subsequent processing steps. For example, implanting a dielectric material with carbon may make it more difficult to subsequently etch vias or conduct post-clean steps. There also needs to be the ability to choose implant species which can accommodate different integration schemes. Accordingly, there remains a need to develop practical methods to improve CMP planarity control in open areas of a wafer without interfering with subsequent processing steps.

DETAILED DESCRIPTION

Specific details of several embodiments of semiconductor structures having implants to modulate CMP material removal rates, and associated systems and methods, are described below. The term "semiconductor structure" generally refers to a structure having integrated circuits or components, data storage elements, processing components, and/or other features manufactured on semiconductor substrates. For example, semiconductor structures can include integrated circuit memory and/or logic circuitry. A person skilled in the relevant art will also understand that the technology may have additional embodiments, and that the technology may be practiced without several of the details of the embodiments described below with reference to FIGS. 1A-5.

As used herein, the terms "vertical," "lateral," "upper" and "lower" can refer to relative directions or positions of features in the semiconductor structures in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
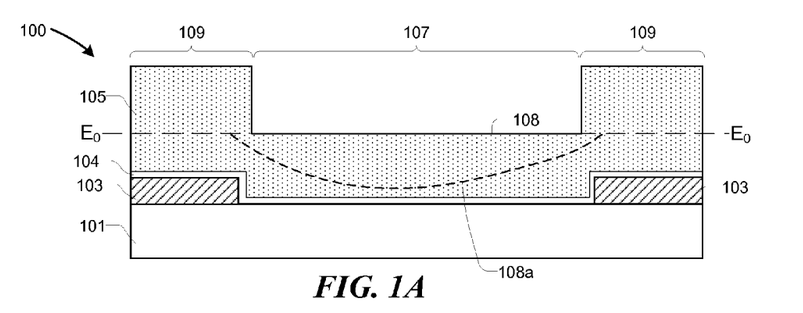
FIGS. 1A-1E are cross-sectional views illustrating a method of planarizing a semiconductor structure in accordance with embodiments of the present technology.

FIGS. 1A-1E are cross-sectional views illustrating a method of planarizing a semiconductor structure 100 in accordance with embodiments of the present technology. Referring to FIG. 1A, the structure 100 includes a substrate 101 having integrated circuits (ICs) 103 formed in or on the substrate 101, a stopping material 104, for example silicon nitride or poly silicon, that covers both the ICs 103 and the substrate 101, and a dielectric material 105 that covers the stopping material 104. The ICs 103 can be formed in or on the substrate 101 using conventional semiconductor processing techniques. The dielectric material 105 can be, for example, a dielectric film such as silicon dioxide or another insulating material. The structure 100 includes a first region 107 and a second region 109. The first region 107 of the substrate 101 can be associated with a low density, or no density, of features and the second region 109 of the substrate 101 can be associated with a relatively higher density of features. The dielectric material 105 in the first region 107 can cover the portion of the substrate 101 with a low density of circuit elements (e.g., areas where no ICs 103 are formed), while the dielectric material 105 in the second region 109 can cover the portion of the substrate 101 with a high density of circuit elements (e.g., areas where the ICs 103 are formed). The first region 107 in FIG. 1A is an example of an "open" area having a low density of circuit elements, which as noted above can be susceptible to dishing during CMP processes. In general, CMP processing may remove material at the lower surface 108 of the dielectric material 105 in the first region 107 even though it is far below the elevation of the surface of the dielectric material 105 in the second region 109 because the planarization pad tends to conform to the surfaces of the first and second regions 107 and 109. Thus, instead of planarizing the surface to be flat, by the time that the portions of the dielectric material 105 in the second region 109 reach the original elevation $E_o$ of the lower surface 108 in the first region 107, a depression 108a (shown in dotted line) may remain in the dielectric material 105. As described in more detail below, an implant can be used to modulate the CMP material removal rate of the dielectric material 105 in the first region 107 to improve planarity.

Figure 1B:
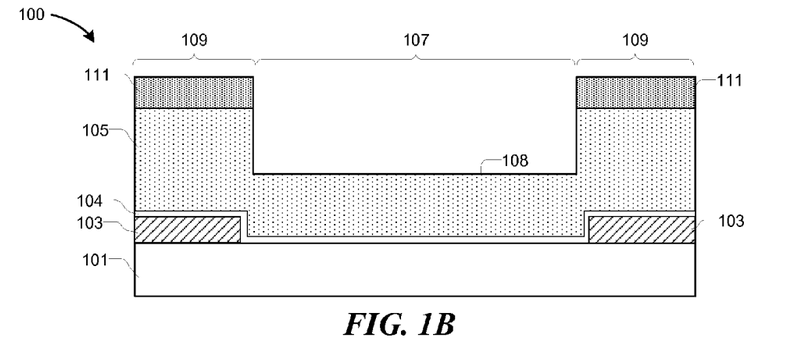

FIG. 1B illustrates the structure 100 after a mask 111 has been disposed over the second region 109 of the dielectric material 105. The mask 111 can be, for example, a photoresist mask formed using conventional semiconductor manufacturing processes. In some embodiments, the mask 111 can be formed by depositing a blanket layer of photoresist over the dielectric material 105, exposing the photoresist material to a pattern of light corresponding to the locations of the first and second regions 107 and 109 of the dielectric material 105, and then selectively removing portions of the photoresist material such that the patterned mask 111 remains. The mask 111, for example, can be over the second region 109. In some embodiments the mask 111 can be hard mask (e.g., polysilicon, titanium nitride, silicon nitride, etc.) or other type of mask.

Figure 1C:
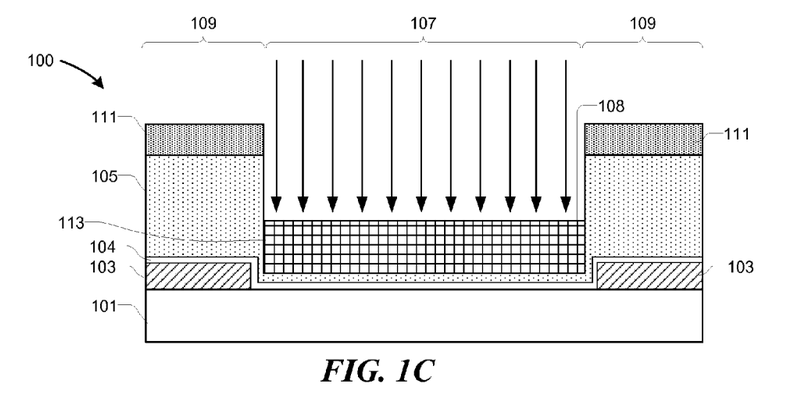

FIG. 1C shows an implant 113 being delivered to the first region 107 of the dielectric material 105 while the mask 111 prevents the implant 113 from reaching the second region 109 of the dielectric material 105. The implant 113 can be delivered using a plasma implant, a beamline implant, or other implanting techniques. In one embodiment, the implant 113 can be configured to decrease the material removal rate of a CMP process for the dielectric material 105. As a result, the dielectric material 105 in the first region 107 has a lower removal rate than that in the second region 109 to prevent or at least inhibit dishing in the first region 107 in subsequent CMP processing. The implant 113 can include, for example, silicon, germanium, or both. The amount of silicon, germanium, or other implant material can be varied to achieve the desired material removal rate of the dielectric material 105 in the first region 107.

Figure 1D:
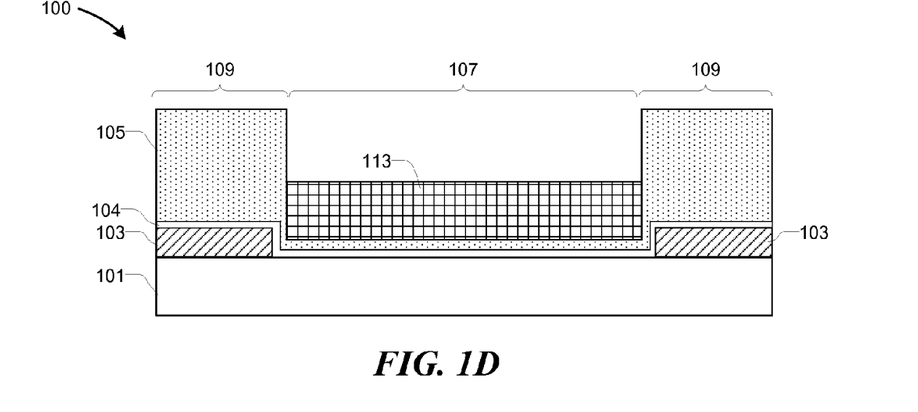
Figure 1E:
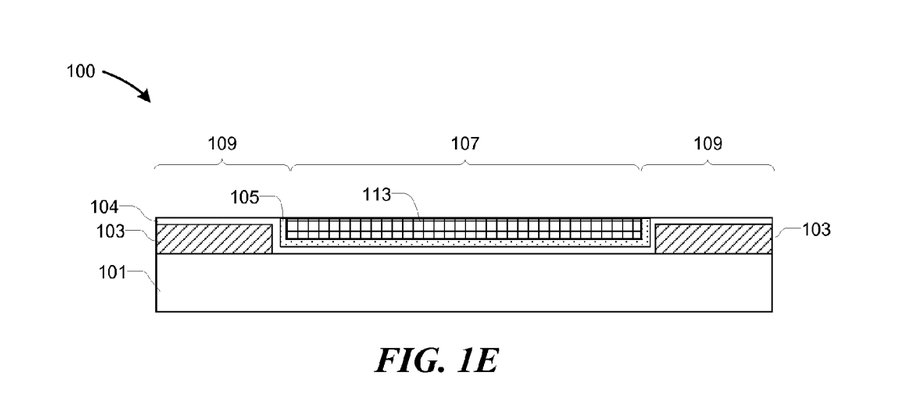

FIG. 1D illustrates the structure 100 after the mask 111 has been stripped from the second region 109 of the dielectric material 105. The mask 111 can be removed using conventional techniques, for example a plasma treatment, a solvent, etc. FIG. 1E illustrates the structure 100 after a CMP process has been performed. As illustrated, the dielectric material 105 has been planarized. During CMP processing, the dielectric material 105 in the second region 109 (untreated by the implant 113) has a higher removal rate than the dielectric material 105 in the first region 107 because the implant 113 reduces the removal rate of the dielectric material 105 in the first region 107. As a result, the planarizing pad does not dish as much such that the structure 100 has improved planarity compared to without the implant 113.

Although in the illustrated embodiment the dielectric material 105 is coplanar with the stopping material 104, in other embodiments the CMP process can be performed such that the dielectric material 105 is not coplanar with the stopping material 104. For example, in some embodiments (not shown) the dielectric material 105 may extend over the stopping material 104 after the CMP step, and a thickness of the dielectric material 105 in the first region 107 may be greater than a thickness of the dielectric material 105 in the second region 109. In some embodiments the first region 107 of the dielectric material 105 can include an inner region and an outer region having different silicon or germanium contents. For example, the dielectric material 105 in the first region 107 can include an inner region that is closer to the substrate 101 and an outer region that is further from the substrate 101 than the inner region. In some embodiments, the implant 113 can extend to the outer region but not to the inner region, such that the outer region has a higher silicon or germanium content, and the inner region has a lower content of silicon or germanium. The implant energy can be selected so that the implant 113 does not extend through the entire thickness of the dielectric material 105 in the first region 107, but rather can be selected so that the implant 113 only extends into the outer region without reaching the inner region.

The effect of the implant 113 can be specific to certain slurries associated with the CMP process. For example, a CMP process utilizing a ceria-based slurry to remove material from a silicon dioxide film may have a material removal rate that is decreased in the presence of a silicon or germanium implant which can be delivered using plasma implant (PLAD), beamline implant, or other implanting techniques, whereas other slurries may be unaffected by the varying concentration of silicon or germanium in the silicon dioxide film. The degree of the effect on material removal rate may also vary based on the CMP process parameters (e.g., type of slurry, pressure applied to the rotating pad, duration, etc.), implant parameters (e.g., implant species, implant total dose, depth of implant, etc.), and features of the semiconductor structure (e.g., size of the open areas, topography prior to CMP, composition of dielectric film, etc.).

Figure 2A:
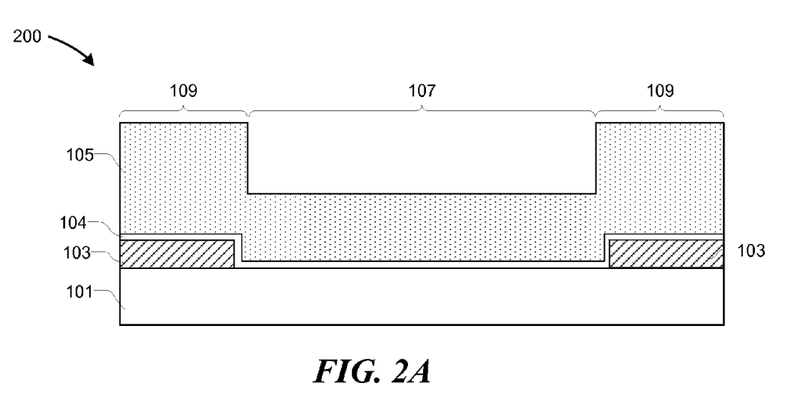
FIGS. 2A-2D are cross-sectional views illustrating another method of planarizing a semiconductor structure in accordance with embodiments of the present technology.

FIGS. 2A-2D are cross-sectional views illustrating another method of planarizing a semiconductor structure 200 in accordance with embodiments of the present technology. Like reference numbers refer to like components in FIGS. 1A-2D. Referring to FIG. 2A, the structure 200 includes the substrate 101, ICs 103 formed on or in the substrate 101, the stopping material 104 disposed over the substrate 101 and the ICs 103, and the dielectric material 105 disposed over the stopping material 104.

Figure 2B:
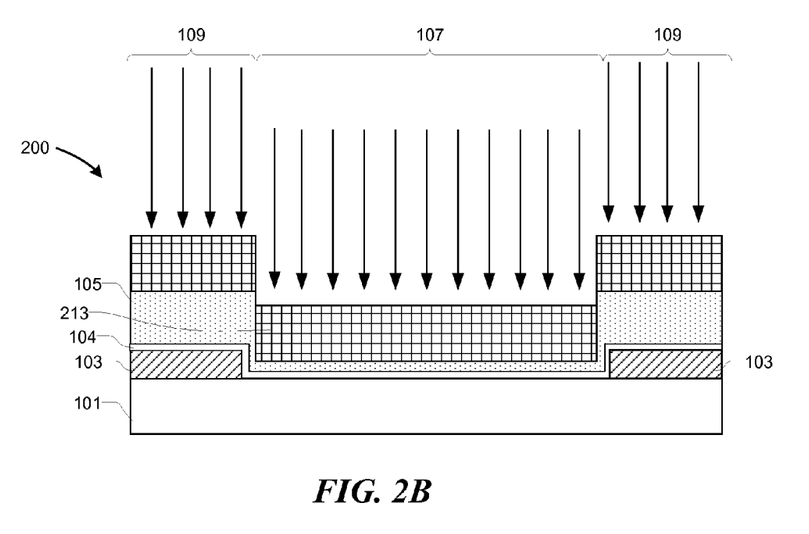
Figure 2C:
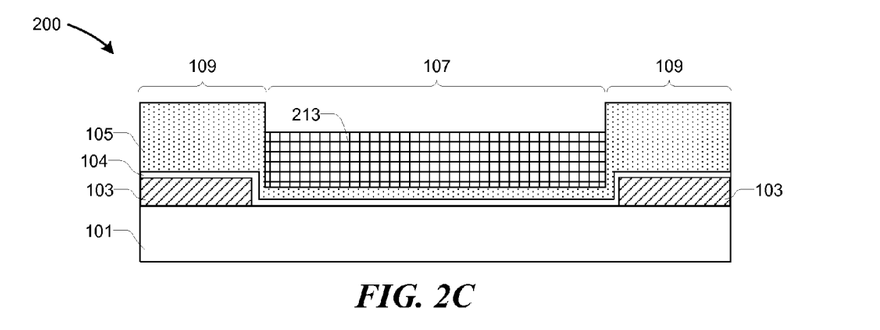

In FIG. 2B, an implant 213 is delivered to the dielectric material 105 in both the first region 107 and in the second region 109. The implant 213 can be delivered using plasma implant, beamline implant, or other implanting techniques. In some embodiments, the implant 213 can be applied as a blanket layer. The implant 213 can be configured to decrease the material removal rate of a CMP process for the dielectric material, and can include, for example, silicon, germanium, or both. FIG. 2C illustrates the structure 200 after a first CMP process has been applied. Although the first CMP process can be non-selective with respect to the dielectric material 105 after it has been implanted with the implant 213, the removal rate in the second region 109 is higher than that in the first region 107 because the pad exerts more pressure in the second region 109 than the first region 107. Moreover, because the implant 213 reduces the removal rate of the dielectric material 105, the difference between the removal rates of the dielectric material 105 in the first and second regions 107 and 109 is greater with the implant 213 than without it. As a result, the first CMP process can remove the implanted portion of the dielectric material 105 in the second region 109 without completely removing the implanted material in the first region 107 as shown in FIG. 2C.

Figure 2D:
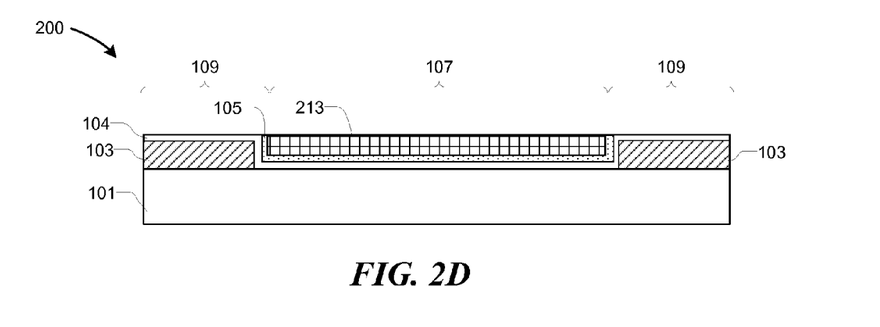

FIG. 2D illustrates the structure 200 after a second CMP process has been performed. The second CMP process can be selective with respect to the implant 213 such that the material removal rate of the dielectric material 105 in the first region 107 is lower than the material removal rate of the dielectric material 105 in the second region 109. As a result, the structure 200 achieves improved planarity via the CMP process compared to what would be achieved without the implant 213 as explained above with respect to FIG. 1E.

Figure 3A:
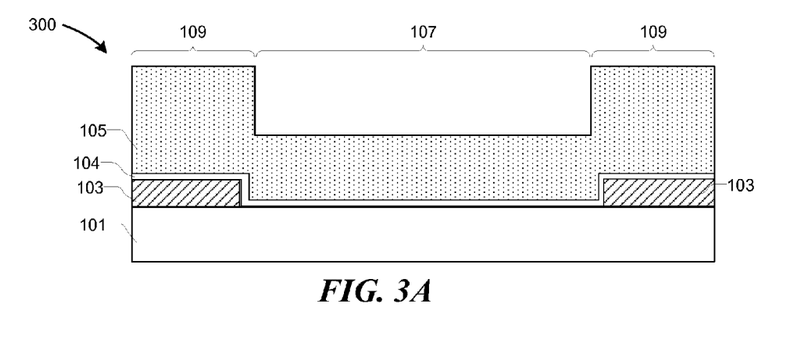
FIGS. 3A-3E are cross-sectional views illustrating yet another method of planarizing a semiconductor structure in accordance with embodiments of the present technology.

FIGS. 3A-3E are cross-sectional views illustrating yet another method of planarizing a semiconductor structure in accordance with embodiments of the present technology. Like reference numbers refer to like components in FIGS. 1A-3E. Referring to FIG. 3A, the structure 300 includes the substrate 101, ICs 103 formed on or in the substrate 101, the stopping material 104 disposed over the substrate 101 and the ICs 103, and the dielectric material 105 disposed over the stopping material 104.

Figure 3B:
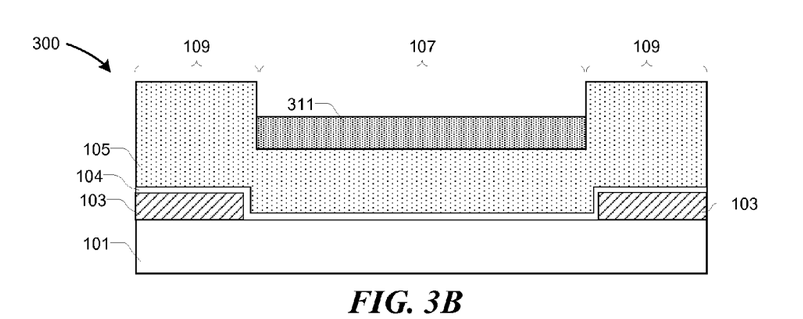
Figure 3C:
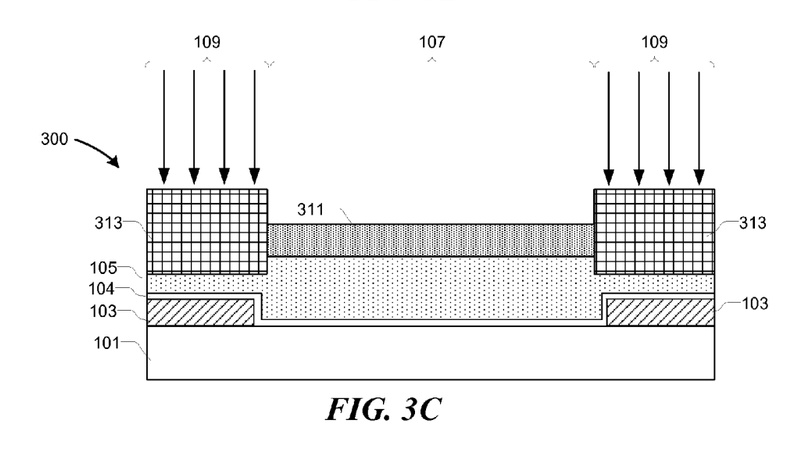

FIG. 3B illustrates the structure 300 after a mask 311 has been disposed over the first region 107 of the dielectric material 105. The mask 311 can be, for example, a photoresist mask formed over the first region 107 using conventional semiconductor manufacturing processes. In FIG. 3C, an implant 313 is delivered to the second region 109 of the dielectric material 105 while the mask 311 prevents the implant 313 from reaching the first region 107 of the dielectric material 105. The implant 313 can be delivered using plasma implant (PLAD), beamline implant, or other implanting techniques. In this embodiment, the implant 313 can be configured to increase the material removal rate of a CMP process for the dielectric material 105 such that the dielectric material 105 in the second region 109 has a higher removal rate than the dielectric material 105 in the first region 107. The implant 313 can include, for example boron, phosphorous, hydrogen, or combinations of elements. By increasing the content of boron, phosphorous, and/or hydrogen in the second region 109 of the dielectric material 105, the implant 313 can increase the material removal rate of a CMP process in the second region 109 and ultimately contribute to a more uniform planarization of the structure 300 using the CMP process. The amount of boron, phosphorous, hydrogen, or other implant provided via the implant 313 can be varied to achieve the desired material removal rate in the second region 109.

Figure 3D:
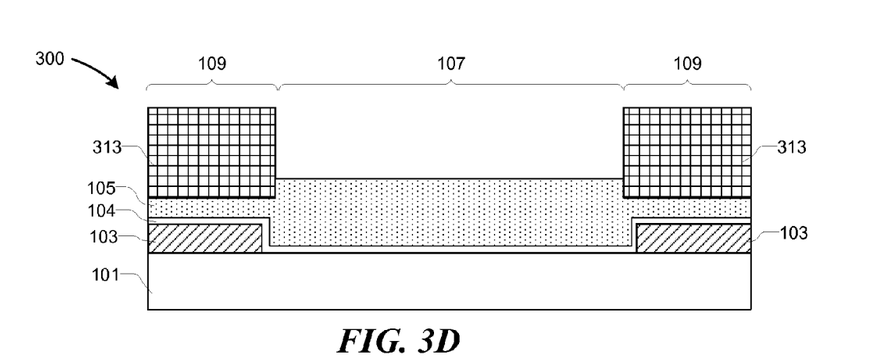
Figure 3E:
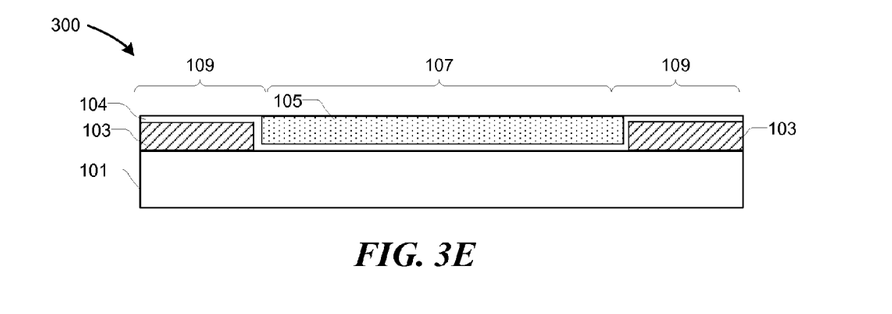

FIG. 3D illustrates the structure 300 after the mask 311 has been stripped from the first region 107 of the dielectric material 105. The mask 311 can be removed using conventional techniques, for example a plasma treatment, a solvent, etc. FIG. 3E illustrates the structure 300 after a CMP process has been performed. During the CMP process, the dielectric material 105 in the first region 107 (untreated by the implant 313) has a generally lower material removal rate than the dielectric material 105 in the second region 109 because the material removal rate of the CMP process in the second region 109 has been increased due to the implant 313. As a result, the structure 300 achieves improved planarity via the CMP process compared to what would be achieved without the implant 313.

Although in the illustrated embodiment the dielectric material 105 is coplanar with the stopping material 104, in other embodiments the CMP process can be performed such that the dielectric material 105 is not coplanar with the stopping material 104. For example, in some embodiments (not shown) the dielectric material 105 may extend over the stopping material 104 after the CMP step, and a thickness of the dielectric material 105 in the first region 107 may be greater than a thickness of the dielectric material 105 in the second region 109.

As noted above, the species of implant can be selected to either reduce or increase the material removal rate of certain CMP processes in selected regions of the wafer. The effect of the implant can vary depending on the slurry associated with the CMP process. For example, a CMP process utilizing a ceria-based slurry to remove material from a silicon dioxide film may have a material removal rate that is decreased in the presence of a silicon or germanium implant, and increased in the presence of a boron, phosphorous, or hydrogen implant. The effect on material removal rate may vary based on the CMP process parameters (e.g., type of slurry, pressure applied to the rotating pad, duration, etc.), implant parameters (e.g., implant species, amount, depth of implant, etc.), and features of the semiconductor structure (e.g., size of the open areas, topography prior to CMP, composition of dielectric film, etc.). In general, beamline implants and plasma implants can create different dopant profiles in the dielectric material that can be engineered to specific depths. By varying the CMP process parameters and implant parameters, and by selectively applying the implant to certain regions of the dielectric material, improved planarity can be achieved via the CMP process. Additionally, the implant may be selected so as not to interfere with subsequent processing steps (e.g., later post-cleans, via etching, etc.).

Figure 4:
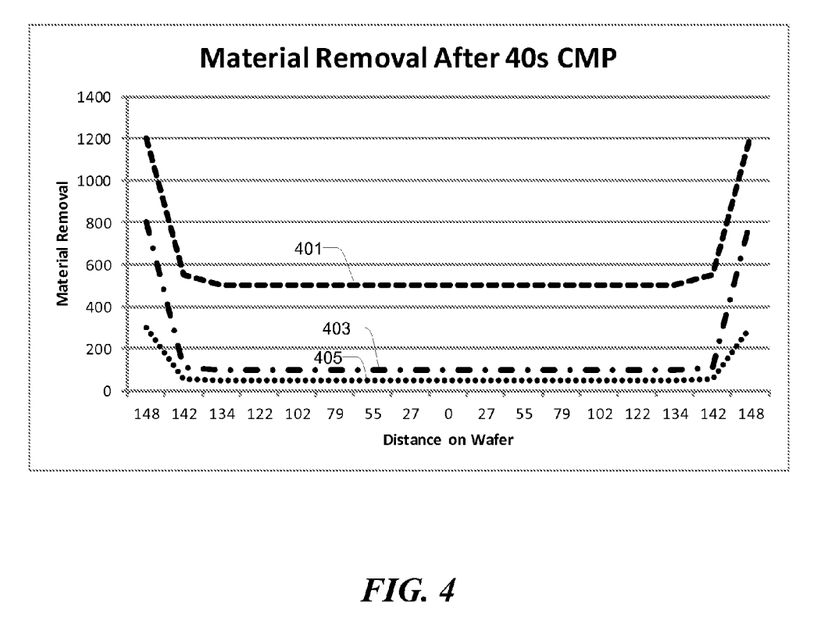
FIG. 4 is a graph of silicon dioxide removal for wafers having varying silicon content.

FIG. 4 is a graph of silicon dioxide removal for wafers having varying silicon content. In particular, FIG. 4 shows data corresponding to the amount of material removed from a silicon dioxide film during a 40 second CMP process for semiconductor wafers subjected to different implant treatments. Plot 401 illustrates the silicon dioxide removal across the width of the wafer for the baseline case in which no implant has been applied to the silicon dioxide. Plot 403 illustrates the removal rate for the case in which a silicon implant has been applied using a first implant. Plot 405 illustrates the removal rate for the case in which a silicon implant has been applied using a second implant having a higher energy and/or higher dose than the first implant. The wafer associated with plot 405 therefore reflects the highest content of silicon, followed by the wafer associated with plot 403, and the wafer associate with plot 401 (untreated) having the lowest silicon content. In one example, plot 405 can correspond to an implant dosage of $4.0E16/cm^2$ at 20 keV, and plot 403 can correspond to an implant dosage of $1.0E16/cm^2$ at 12 keV. In other examples higher or lower implant doses can be used to vary the silicon content.

As illustrated, the wafer having the silicon implant applied with the higher energy/dose implant (plot 405) reflects the least material removed, and therefore the lowest material removal rate for the CMP process. Next, the silicon implant applied with the lower energy/dose implant (plot 403) illustrates a higher material removal rate than plot 405, but still a reduced material removal rate compared to the baseline case (plot 401). A similar effect results from using beamline implant processes rather than plasma implant processes to deliver the implant. Similarly, the use of germanium in lieu of silicon also reduces the material removal rate of the dielectric material, with higher germanium content corresponding to greater reductions in material removal rate. For those implant species which increase the material removal rate of a CMP process (e.g., boron, phosphorus, or hydrogen), the effect can be reversed such that higher energy and/or doses of the implant—and therefore the higher the increased content of boron, phosphorous, and/or hydrogen—result in increased material removal rates. As noted above, these implants can be advantageously employed to modulate the CMP material removal rates in select areas of a dielectric material to achieve improved planarity.

Figure 5:
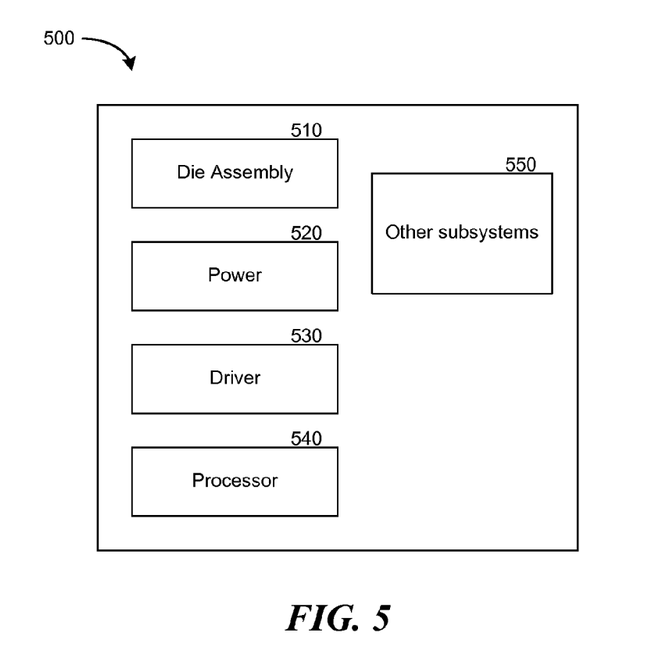
FIG. 5 is a schematic view of a system that includes a semiconductor die configured in accordance with embodiments of the present technology.

Any one of the semiconductor structures described above with reference to FIGS. 1A-4 can be incorporated into any of a myriad of larger and/or more complex systems, a representative example of which is system 500 shown schematically in FIG. 5. The system 500 can include a semiconductor die assembly 510, a power source 520, a driver 530, a processor 540, and/or other subsystems or components 550. The semiconductor die assembly 510 can include features generally similar to those of the stacked semiconductor die assemblies described above, and can therefore include an implant in select regions of a dielectric film to improve planarity of a CMP process. The resulting system 500 can perform any of a wide variety of functions, such as memory storage, data processing, and/or other suitable functions. Accordingly, representative systems 500 can include, without limitation, handheld devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer-readable media.

From the foregoing, it will be appreciated that specific embodiments of the invention have been described herein for purposes of illustration, but that various modifications may be made without deviating from the disclosure. Certain aspects of the new technology described in the context of particular embodiments may also be combined or eliminated in other embodiments. For example, the process described above with respect to FIGS. 1A-1D can be combined with the process described with respect to FIGS. 3A-3D such that the dielectric material 105 in the first region 107 is implanted with silicon and/or germanium (decreasing the material removal rate) and the dielectric material 105 in the second region 109 is implanted with boron, phosphorus, and/or hydrogen (increasing the material removal rate). The resulting structure could then be planarized to the stopping material 104 as shown in FIG. 1E. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:
    increasing the content of at least one of silicon or germanium in at least select regions of a dielectric material and thereby reducing a material removal rate of a chemical mechanical planarization (CMP) process at the select regions;
    removing material from the dielectric material using the CMP process,
    wherein increasing content of at least one of silicon or germanium comprises:
        masking non-select regions of the dielectric material; and
        implanting silicon or germanium in the select regions.

2. The method of claim 1, wherein non-select regions of the dielectric material comprise a higher pattern density of features than the select regions of the dielectric material.

3. The method of claim 1, further comprising
    removing a mask from the non-select regions of the dielectric material before removing material from the dielectric material using the CMP process.

4. The method of claim 1, wherein increasing the content of at least one of silicon or germanium comprises applying a plasma implant to the dielectric material.

5. The method of claim 1, wherein increasing the content of at least one of silicon or germanium comprises applying a beamline implant to the dielectric material.

6. The method of claim 1, wherein the dielectric material comprises silicon dioxide.

7. A method of manufacturing a semiconductor device, the method comprising:
    increasing the content of at least one of silicon or germanium in at least select regions of a dielectric material and thereby reducing a material removal rate of a chemical mechanical planarization (CMP) process at the select regions;
    removing material from the dielectric material using the CMP process,
    wherein increasing content of at least one of silicon or germanium comprises:
        implanting silicon or germanium in the dielectric material in a blanket layer;
        removing material from non-select regions of the dielectric material using a first CMP process and thereby exposing a portion of the dielectric material under the implanted silicon or germanium in the non-select regions of the dielectric material; and
        removing additional dielectric material using a second CMP process that removes the exposed material from the non-select regions at a faster rate than from the select regions.

8. The method of claim 7, wherein the first CMP process comprises a preliminary CMP process having a material removal rate that does not vary based on the silicon or germanium content of the dielectric material.

9. The method of claim 8, wherein the second CMP process is performed after the preliminary CMP process.

10. A method of manufacturing a semiconductor device, the method comprising:
    increasing the content of at least one of boron, phosphorus, or hydrogen in at least select regions of a dielectric material and thereby increasing a material removal rate of a chemical mechanical planarization (CMP) process at the select regions;
    removing material from the dielectric material using the CMP process,
    wherein increasing the content of at least one of boron, phosphorus, or hydrogen comprises:
        masking non-select regions of the dielectric material; and
        implanting boron, phosphorous, or hydrogen in the select regions.

11. The method of claim 10, further comprising removing a mask from the non-select regions of the dielectric material before removing material from the dielectric material using the CMP process.

12. The method of claim 10, wherein increasing the content of at least one of boron, phosphorus, or hydrogen comprises applying a plasma implant to the dielectric material.

13. The method of claim 10, wherein increasing the content of at least one of boron, phosphorous, or hydrogen comprises applying a beamline implant to the dielectric material.

14. The method of claim 10, wherein the dielectric material comprises silicon dioxide.

15. A semiconductor structure comprising:
    a substrate having a first region and a second region, wherein the second region has a higher pattern density of circuit elements than the first region;
    a dielectric material over the first region of the substrate and over at least a portion of the second region of the substrate;
    wherein the content of at least one of silicon or germanium in the dielectric material is greater over the first region than over the second region.

16. The semiconductor structure of claim 15, wherein the circuit elements comprise a wire or an interconnect formed in or on the substrate.

17. The semiconductor structure of claim 15, wherein the dielectric material comprises silicon dioxide.

18. The semiconductor structure of claim 15, wherein a thickness of the dielectric material is greater over the first region than over the second region.

19. A semiconductor structure comprising:
    a substrate having a first region and a second region, wherein the second region has a higher pattern density of circuit elements than the first region;
    a dielectric material over the first region of the substrate and over at least a portion of the second region of the substrate;
    wherein the content of at least one of boron, phosphorus, or hydrogen in the dielectric material is greater over the second region than over the first region.

20. The semiconductor structure of claim 19, wherein the circuit elements comprise a wire or an interconnect formed in or on the substrate.

21. The semiconductor structure of claim 19, wherein the dielectric material comprises silicon dioxide.

22. The semiconductor structure of claim 19, wherein a thickness of the dielectric material is greater over the first region than over the second region.

23. A semiconductor structure comprising:
  a substrate having a first region and a second region, the second region having a higher pattern density of circuit elements than the first region;
  a dielectric material over the first region and the second region, the first region of the dielectric material having an inner region and an outer region;
  wherein the content of at least one of silicon or germanium in the dielectric material is greater in the outer region than in the inner region, and
  wherein the content of at least one of silicon or germanium in the dielectric material is greater in the outer region than over the second region.

24. The semiconductor structure of claim 23, wherein the inner region of the dielectric material is closer to the substrate than the outer region.

25. The semiconductor structure of claim 23, wherein the dielectric material comprises silicon dioxide.

* * * * *